(12) United States Patent
Kuo et al.

(10) Patent No.: US 7,667,479 B2
(45) Date of Patent: Feb. 23, 2010

(54) APPARATUS FOR TESTING CONCENTRATION-TYPE SOLAR CELLS

(75) Inventors: Hung-zen Kuo, Longtan Shiang (TW); Chun-yi Chen, Longtan Shiang (TW); Hwa-Yuh Shin, Longtan Shiang (TW); Hwen-Fen Hong, Longtan Shiang (TW); Wen-Fu Chen, Longtan Shiang (TW); Cherng-Tsong Kuo, Longtan Shiang (TW)

(73) Assignee: Atomic Energy Council, Taoyuan (TW)

( * ) Notice: Subject to any disclaimer, the term of this patent is extended or adjusted under 35 U.S.C. 154(b) by 231 days.

(21) Appl. No.: 11/980,744

(22) Filed: Oct. 31, 2007

(65) Prior Publication Data

US 2009/0108857 A1      Apr. 30, 2009

(51) Int. Cl.
*G01R 31/26*    (2006.01)
*H01L 31/00*    (2006.01)

(52) U.S. Cl. .................................... 324/765; 136/259
(58) Field of Classification Search .................. None
See application file for complete search history.

(56) References Cited

U.S. PATENT DOCUMENTS

| 4,712,063 | A | * | 12/1987 | Osterwald et al. | 324/766 |
| 5,731,708 | A | * | 3/1998 | Sobhani | 324/758 |
| 6,154,034 | A | * | 11/2000 | Lovelady et al. | 324/765 |
| 6,359,212 | B1 | * | 3/2002 | Hall et al. | 324/765 |
| 6,639,421 | B1 | * | 10/2003 | Yoshino et al. | 324/767 |
| 2002/0171441 | A1 | * | 11/2002 | Jayamaha | 324/752 |
| 2006/0103371 | A1 | * | 5/2006 | Manz | 324/158.1 |
| 2007/0068567 | A1 | * | 3/2007 | Rubin et al. | 136/290 |
| 2009/0278546 | A1 | * | 11/2009 | Chen | 324/501 |

* cited by examiner

*Primary Examiner*—Jermele M Hollington
(74) *Attorney, Agent, or Firm*—Jackson IPG PLLC

(57) ABSTRACT

There is disclosed an apparatus for testing concentration-type solar cells. The apparatus includes a light source for emitting light, a focusing unit for focusing the light emitted from the light source and turning the same into a light beam, a testing unit for testing any one of solar cells of a wafer; and a wafer-positioning unit for moving the wafer horizontally and vertically, thus brining a targeted one of the solar cells into contact with the testing unit.

10 Claims, 5 Drawing Sheets

APPARATUS FOR TESTING CONCENTRATION-TYPE SOLAR CELLS

BACKGROUND OF INVENTION

1. Field of Invention

The present invention relates to concentration-type solar cells and, more particularly, to an efficient, effective and inexpensive apparatus for testing concentration-type solar cells.

2. Related Prior Art

Solar cells are popular for being environmentally friendly and economic in use. The efficiencies of solar cells are becoming higher and higher while the prices are becoming lower and lower. Therefore, solar cells are getting more and more attention. To increase the efficiency of a solar cell and reduce the cost of the same, more and more effort are made to develop concentration-type solar cells of III-V compounds. Therefore, there is a need for an efficient and effective apparatus to test these tiny concentration-type solar cells of III-V compounds. Such an apparatus is however expensive.

The present invention is therefore intended to obviate or at least alleviate the problems encountered in prior art.

SUMMARY OF INVENTION

It is the primary objective of the present invention to provide an efficient, effective and inexpensive apparatus for testing concentration-type solar cells.

To achieve the foregoing objective, an apparatus includes a light source for emitting light, a focusing unit for focusing the light emitted from the light source and turning the same into a light beam, a testing unit for testing any one of solar cells of a wafer; and a wafer-positioning unit for moving the wafer horizontally and vertically, thus brining a targeted one of the solar cells into contact with the testing unit.

Other objectives, advantages and features of the present invention will become apparent from the following description referring to the attached drawings.

BRIEF DESCRIPTION OF DRAWINGS

The present invention will be described via the detailed illustration of the preferred embodiment referring to the drawings.

DETAILED DESCRIPTION OF PREFERRED EMBODIMENT

Figure 1:
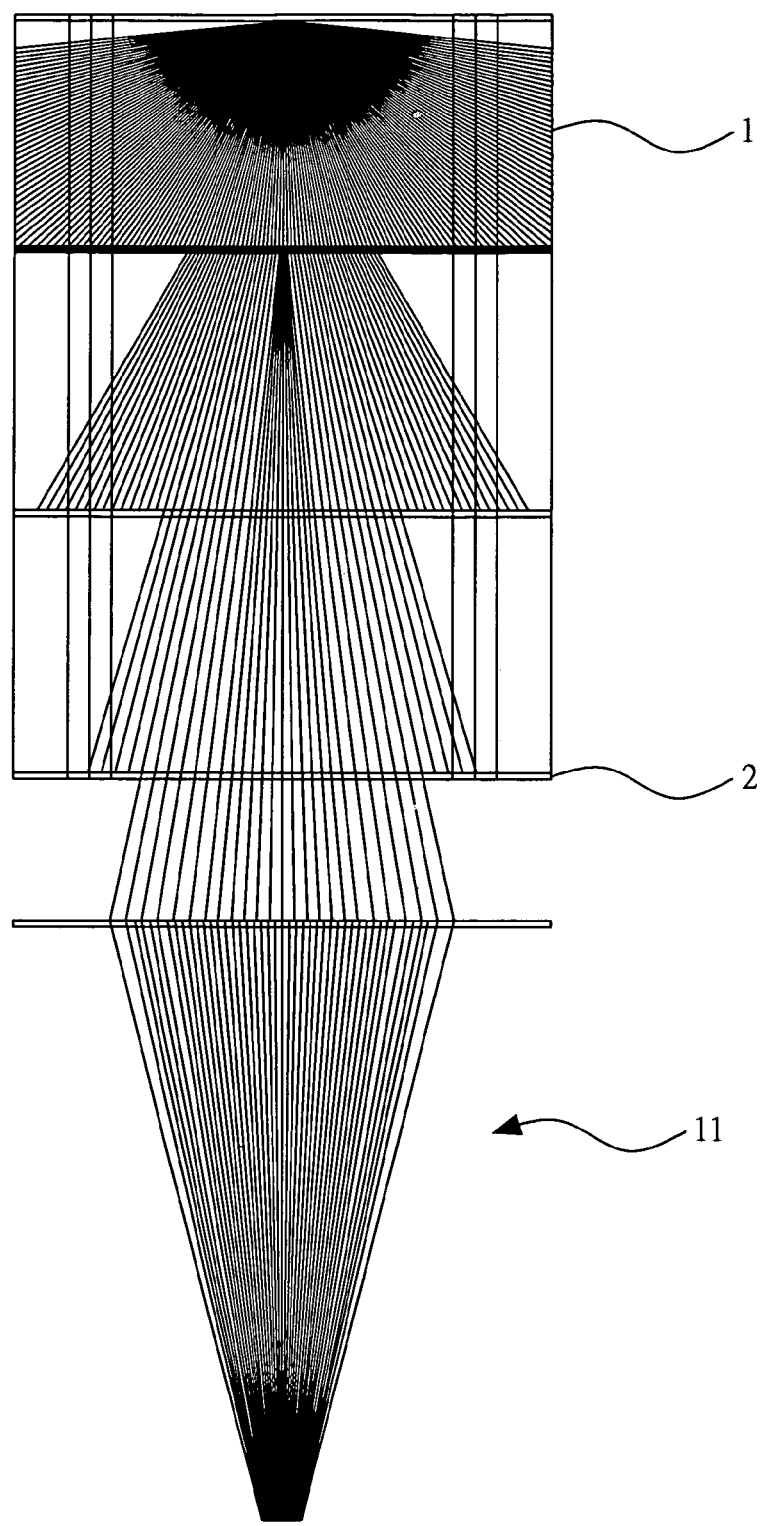
FIG. 1 is a top view of a light source and a focusing unit of an apparatus for testing concentration-type solar cells according to the preferred embodiment of the present invention.
Figure 2:
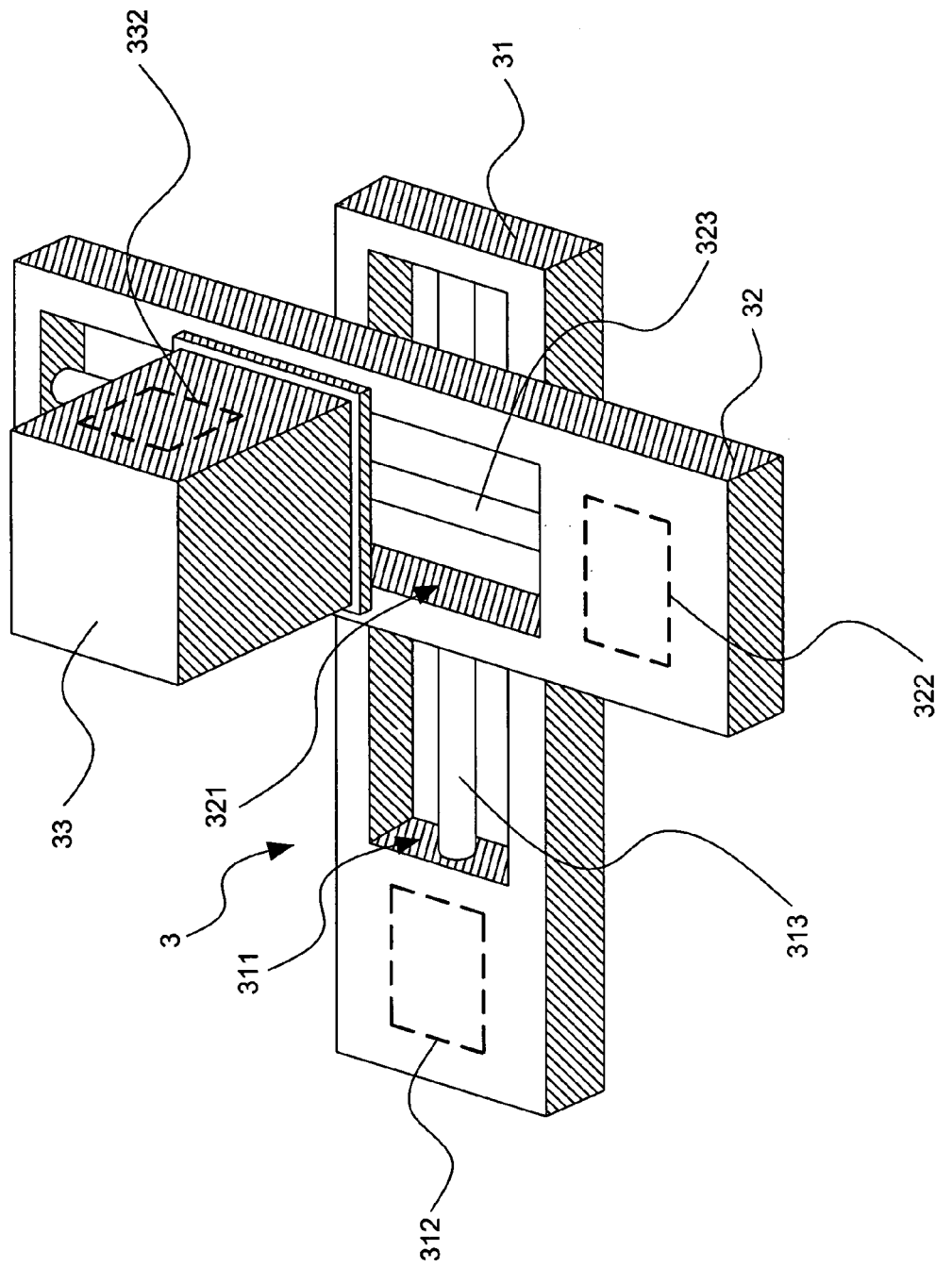
FIG. 2 is a perspective view of a wafer-positioning unit of the apparatus according to the preferred embodiment of the present invention.
Figure 3:
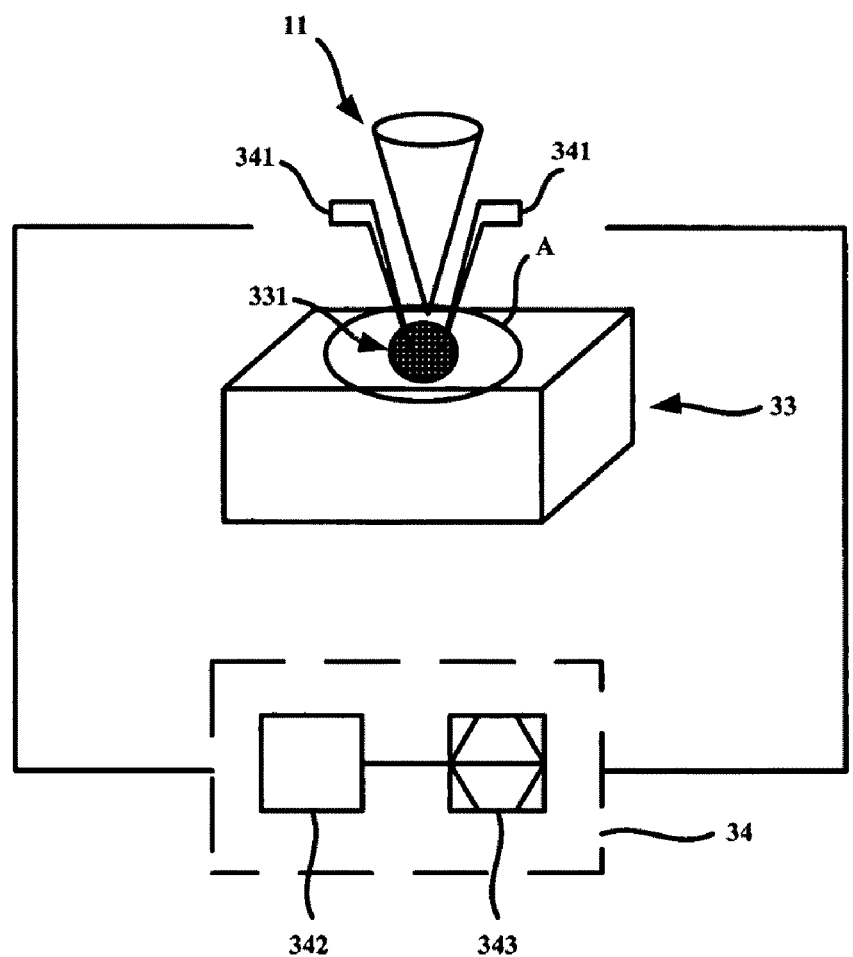
FIG. 3 is a perspective view of a testing unit of the apparatus according to the preferred embodiment of the present invention.

Referring to FIGS. 1 through 3, there is shown an apparatus for testing concentration-type solar cells according to the preferred embodiment of the present invention. The apparatus includes a light source 1, a focusing unit 2, a wafer-positioning unit 3 and a testing unit 34.

The light source 1 may be a light-emitting diode ("LED"), a solar simulator, a halogen lamp or any other proper lamp for use in any ordinary instrument. The light source 1 is used to emit light.

The focusing unit 2 may be an aperture defined in a plate or a condenser lens. The focusing unit 2 is used to focus the light emitted from the light source 1 and turns the light into a light beam 11.

As clearly shown in FIG. 2, the wafer-positioning unit 3 includes a first workbench 31, a second workbench 32 and an elevator 33. The first workbench 31 includes a slot 311 defined therein, a screw 313 disposed in the slot 311 and a driving element 312 operatively connected to the screw 313.

The second workbench 32 includes a slot 321 defined therein, a screw 323 disposed in the slot 321 and a driving element 322 operatively connected to the screw 323. The second workbench 32 is provided on the first workbench 31. Although not shown, the second workbench 32 includes a nut attached to the bottom. The nut of the second workbench 32 is engaged with the screw 313 of the first workbench 31 so that the second workbench 32 is moved in a first direction when the screw 313 is rotated by the driving element 312 of the first workbench 31.

Figure 4:
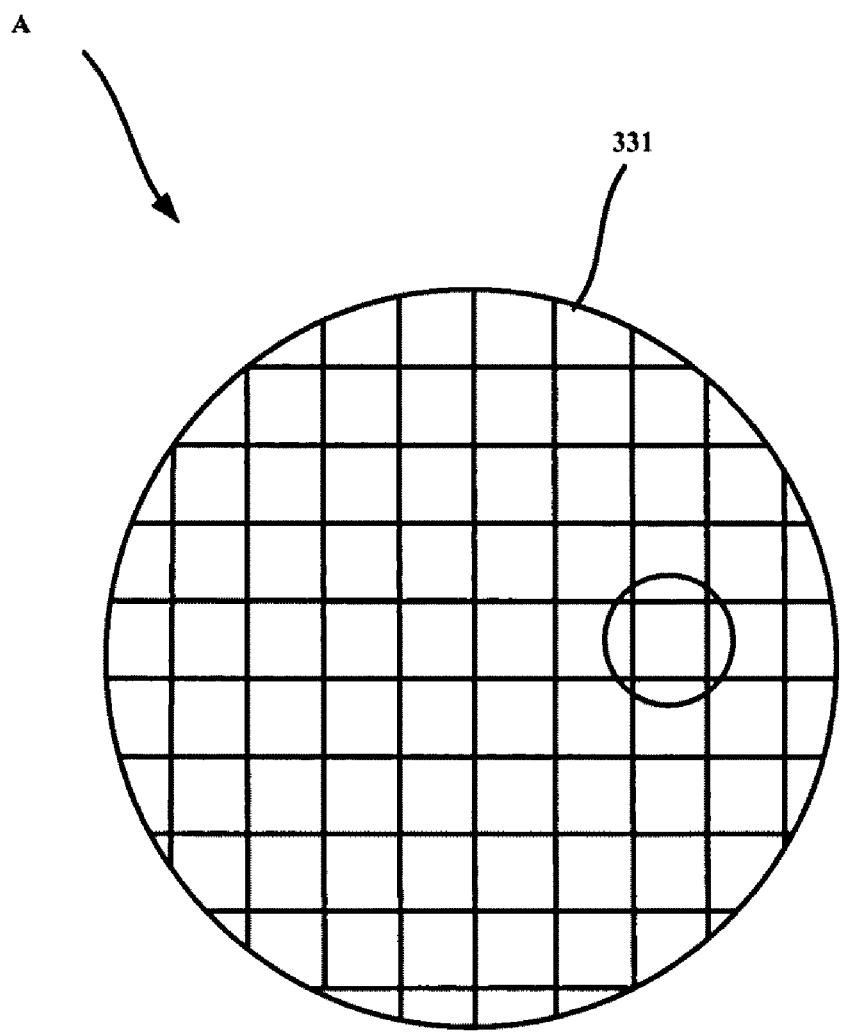
FIG. 4 is a top view of a wafer to be tested by the apparatus according to the preferred embodiment of the present invention.
Figure 5:
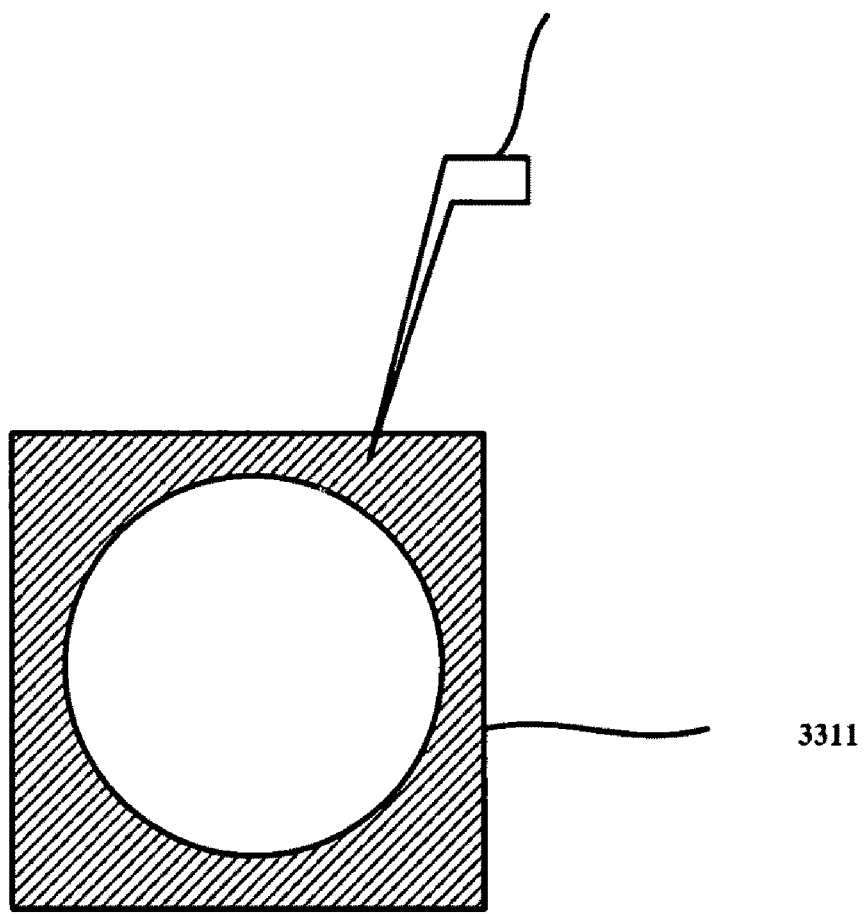
FIG. 5 is an enlarged partial view of the wafer shown in FIG. 4.

The elevator 33 is used to support a wafer 331. As clearly shown in FIGS. 4 and 5, the wafer 331 includes a lot of solar cells 3311 each in the form of a chip. Although not shown, the elevator 33 includes a nut attached to the bottom. The nut of the elevator 33 is engaged with the screw 323 of the second workbench 32 so that the second workbench 32 is moved in a second direction when the screw 323 is rotated by the driving element 322 of the second workbench 32. The second direction is perpendicular to the first direction. Thus, the horizontal position of the wafer 331 can be changed because of the first workbench 31 and the second workbench 32. The elevator 33 includes a driving element 332 operable to change the vertical position of the wafer 331.

As clearly shown in FIG. 3, the testing unit 34 includes two probes 341, a testing element 342 connected to the probes 341 and a computer 343 connected to the testing element 342. Moreover, the computer 343 is connected to the driving elements 312, 322 and 332. The probes 341 are retained in position, horizontally and vertically.

To test any one of the solar cells 3311 of the wafer 331 (the "target"), the light source 1 emits light. The focusing unit 2 focuses the light emitted from the light source 1 and turns the same into a light beam 11. At this instant, the wafer 331 is not in contact with the probes 341. Under the control of the computer 343, the driving elements 312 and 322 move the wafer 331 horizontally so that the target is right below the probes 341. Under the control of the computer 343, the driving element 332 lifts the wafer 331 and brings the target into contact with the probes 341. The probes 341 acquire various parameters of the target such as the open circuit voltage, the short circuit current, the maximum voltage and the maximum current. Based on these parameters, the computer 343 calculates the fill factor and the photo-electric conversion efficiency of the target.

As discussed above, the present invention provides an efficient, effective and inexpensive the apparatus for testing concentration-type solar cells.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. An apparatus for testing concentration-type solar cells, the apparatus comprising:
   a light source for emitting light;
   a focusing unit for focusing the light emitted from the light source and turning the same into a light beam;
   a testing unit for testing any one of a plurality of solar cells of a wafer, the testing unit comprising two probes arranged for contact with the targeted one of the solar cells of the wafer and wherein the probes are fixed horizontally and vertically; and
   a wafer-positioning unit for moving the wafer horizontally and vertically comprising a first workbench engaged with a nut of a second workbench such that the second workbench is movable on the first workbench in a first horizontal direction and wherein a nut of an elevator is engaged with the second workbench such that the elevator is movable on the second workbench in a second horizontal direction perpendicular to the first direction and wherein the elevator is movable in a vertical direction and engageable with the wafer thus bringing a targeted one of the solar cells into contact with the testing unit.

2. The apparatus according to claim 1, wherein the light source is selected from a group consisting of a light-emitting diode, a solar simulator, a halogen lamp and an instrument-used lamp.

3. The apparatus according to claim 1, wherein the focusing unit is selected from a group consisting of an aperture defined in a plate and a condenser lens.

4. The apparatus according to claim 1, wherein the first workbench comprises a screw for moving the second workbench thereon.

5. The apparatus according to claim 4, wherein the first workbench comprises a driving element for driving the screw.

6. The apparatus according to claim 1, wherein the second workbench comprises a screw for moving the elevator thereon.

7. The apparatus according to claim 6, wherein the second workbench comprises a driving element for driving the screw.

8. The apparatus according to claim 1, wherein the testing unit comprises a testing element connected to the probes.

9. The apparatus according to claim 8, wherein the testing unit comprises a computer connected to the testing element.

10. The apparatus according to claim 9, wherein the computer is connected to the wafer-positioning unit.

* * * * *